(12) United States Patent
Tsai et al.

(10) Patent No.: US 9,306,118 B2
(45) Date of Patent: Apr. 5, 2016

(54) METHOD OF TREATING SUBSTRATE

(75) Inventors: Chiung-Chi Tsai, Tanzih Township, Taichung County (TW); Tzong-Liang Tsai, Taichung (TW)

(73) Assignee: HUGA OPTOTECH INC., Taichung (TW)

( * ) Notice: Subject to any disclaimer, the term of this patent is extended or adjusted under 35 U.S.C. 154(b) by 1434 days.

(21) Appl. No.: 11/976,872

(22) Filed: Oct. 29, 2007

(65) Prior Publication Data
US 2008/0296588 A1  Dec. 4, 2008

(30) Foreign Application Priority Data

Jun. 1, 2007  (TW) ................................ 96119657 A (51) Int. Cl.
| | | |
|---|---|---|
| H01L 33/00 | (2010.01) | |
| H01L 33/22 | (2010.01) | |
| H01L 29/30 | (2006.01) | |
| H01L 21/304 | (2006.01) | |

(52) U.S. Cl.
CPC ............. *H01L 33/22* (2013.01); *H01L 21/3043* (2013.01); *H01L 29/30* (2013.01)

(58) Field of Classification Search
USPC .................. 257/79, 81, 95, 466, 622; 438/22
IPC ............................. H01L 21/3043,29/30, 33/22
See application file for complete search history.

(56) References Cited

U.S. PATENT DOCUMENTS

| | | | | |
|---|---|---|---|---|
| 4,626,613 A * | 12/1986 | Wenham et al. | ............... | 136/255 |
| 5,621,746 A * | 4/1997 | Futatsugi et al. | .......... | 372/45.01 |
| 5,814,532 A * | 9/1998 | Ichihara | .......................... | 438/33 |
| 5,872,042 A * | 2/1999 | Hsu et al. | ....................... | 438/401 |
| 5,909,048 A * | 6/1999 | Sugino | .......................... | 257/522 |
| 6,316,785 B1 * | 11/2001 | Nunoue et al. | ................... | 257/14 |
| 6,420,791 B1 * | 7/2002 | Huang et al. | ................... | 257/797 |
| 6,452,216 B1 * | 9/2002 | Tsuda et al. | .................... | 257/94 |
| 6,870,191 B2 * | 3/2005 | Niki et al. | ........................ | 257/79 |
| 7,052,979 B2 * | 5/2006 | Nagai et al. | ................... | 438/478 |
| 7,053,420 B2 * | 5/2006 | Tadatomo et al. | ............. | 257/98 |
| 7,470,938 B2 * | 12/2008 | Lee et al. | ........................ | 257/103 |
| 7,572,657 B2 * | 8/2009 | Yakushiji | ........................ | 438/33 |
| 7,683,386 B2 * | 3/2010 | Tanaka et al. | ................... | 257/88 |
| 7,705,440 B2 * | 4/2010 | Wang | .............................. | 257/678 |
| 7,709,341 B2 * | 5/2010 | Fucsko et al. | ................. | 438/389 |
| 7,741,192 B2 * | 6/2010 | Shimoyama et al. | ......... | 438/433 |
| 8,143,081 B2 * | 3/2012 | Cheng et al. | .................... | 438/33 |
| 2002/0001968 A1 * | 1/2002 | Lee et al. | ....................... | 438/745 |
| 2003/0067014 A1 * | 4/2003 | Tsuruta et al. | ................ | 257/200 |
| 2004/0022691 A1 * | 2/2004 | Allen et al. | ..................... | 422/102 |
| 2005/0141577 A1 * | 6/2005 | Ueta et al. | ....................... | 372/43 |
| 2005/0155951 A1 * | 7/2005 | Suzuki et al. | .................. | 216/66 |
| 2005/0186694 A1 * | 8/2005 | Takakura et al. | ............... | 438/28 |
| 2005/0227379 A1 * | 10/2005 | Donofrio | .......................... | 438/4 |

(Continued)

FOREIGN PATENT DOCUMENTS

CN    2867600 Y    2/2007

*Primary Examiner* — Eugene Lee
(74) *Attorney, Agent, or Firm* — Muncy, Geissler, Olds & Lowe PC (57) ABSTRACT

A method of treating a substrate includes forming a plurality of nicks on an upper surface of the substrate by an electromagnetic wave without using a mask, wherein sidewalls of each nick have fusion formed thereon; roughening the sidewalls by removing the fusion; and forming an epitaxial multilayer structure on the upper surface and the nicks. The roughened sidewalls of each nick comprise an average roughness equal to or larger than 1 nm.

8 Claims, 6 Drawing Sheets

(56) References Cited

U.S. PATENT DOCUMENTS

| | | | |
|---|---|---|---|
| 2005/0263778 A1* | 12/2005 | Hata et al. | 257/79 |
| 2005/0268963 A1* | 12/2005 | Jordan et al. | 136/256 |
| 2005/0284571 A1* | 12/2005 | Negishi et al. | 156/345.28 |
| 2006/0038190 A1* | 2/2006 | Park et al. | 257/95 |
| 2006/0094244 A1* | 5/2006 | Yamada et al. | 438/700 |
| 2006/0189017 A1* | 8/2006 | Nogami | 438/46 |
| 2008/0029775 A1* | 2/2008 | Liu et al. | 257/98 |
| 2008/0054293 A1* | 3/2008 | Lai et al. | 257/103 |
| 2008/0070380 A1* | 3/2008 | Kusunoki | 438/462 |
| 2008/0112037 A1* | 5/2008 | Pan et al. | 359/291 |
| 2008/0258165 A1* | 10/2008 | Zimmerman et al. | 257/98 |

\* cited by examiner

METHOD OF TREATING SUBSTRATE

BACKGROUND OF THE INVENTION

1. Field of the Invention

The present invention relates to a substrate and, more particularly, to a substrate for increasing the light-extraction efficiency of a semiconductor light-emitting device.

2. Description of the Prior Art

The current semiconductor light-emitting devices, such as light-emitting diodes, have been used for a wide variety of applications, e.g. illumination, remote control. To ensure high functional reliability as great as possible and a low power requirement of the semiconductor light-emitting devices, the external quantum efficiency is required for the devices.

In principle, the external quantum efficiency of a semiconductor light-emitting device is determined both by the internal quantum efficiency and extraction efficiency. The internal quantum efficiency is determined by the material property and quality. The extraction efficiency refers to the proportion of radiation emitted from the interior of the device into surrounding air or encapsulating epoxy. The extraction efficiency is determined by the losses occurred when radiation leaves the interior of the device. If a total reflection occurred when light is to be emitted out from the semiconductor light-emitting device, light would be reflected repeatedly until being absorbed in the interior of the device, which decreases the external quantum efficiency of the semiconductor light-emitting device.

In the prior art, a surface of a substrate of a semiconductor light-emitting device could be designed to exhibit a particular surface morphology for scattering light emitted out from the semiconductor light-emitting device to reduce the probability of the total reflection, further enhancing the external quantum efficiency of the semiconductor light-emitting device. However, the surface morphology of the above-mentioned substrate is generally formed by a dry etching process or a wet etching process. These processes not only consume much time but cost much.

Therefore, the main scope of the invention is to provide a substrate for epitaxy of a semiconductor light-emitting device, and the substrate is capable of enhancing the light-extraction efficiency of the semiconductor light-emitting device.

SUMMARY OF THE INVENTION

One scope of the invention is to provide a substrate and a fabricating method thereof for epitaxy of a semiconductor light-emitting device.

According to an embodiment of the invention, an upper surface of the substrate has a plurality of electromagnetic-wave-scribed nicks. The epitaxy of the semiconductor light-emitting device is to be performed on the upper surface of the substrate.

According to another embodiment of the invention is related to a method of treating a substrate.

By use of an electromagnetic wave without using a mask, the method scribes an upper surface of the substrate so that the upper surface of the substrate has a plurality of electromagnetic-wave-scribed nicks. The sidewalls of each nick have fusion formed thereon and then the sidewalls are roughened by removing the fusion. The epitaxial multi-layer structure is formed on the upper surface of the substrate. The roughened sidewalls of each nick comprise an average roughness equal to or larger than 1 nm.

Compared to the prior art, the substrate according to the invention is scribed by the electromagnetic wave to form a surface morphology such that light emitted from the semiconductor light-emitting device is scattered to reduce total reflection. Further, the external quantum efficiency and light-extraction efficiency of the semiconductor light-emitting device are enhanced. In particular, a conventional photolithography process is not required (i.e. mask-free) in the process of forming the surface morphology. Therefore, it takes much less time and reduces cost in the process of fabricating the substrate according to the invention.

The advantage and spirit of the invention may be understood by the following recitations together with the appended drawings.

DETAILED DESCRIPTION OF THE INVENTION

Figure 1A:
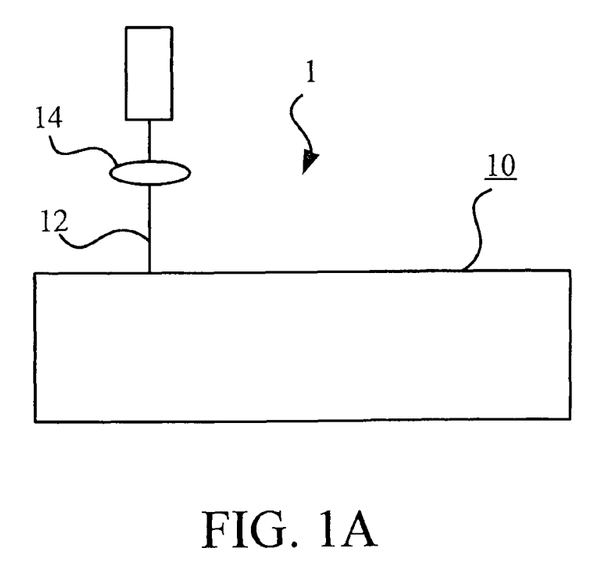
FIG. 1A and FIG. 1B are the schematic diagrams of forming a substrate according to an embodiment of the invention.
Figure 1B:
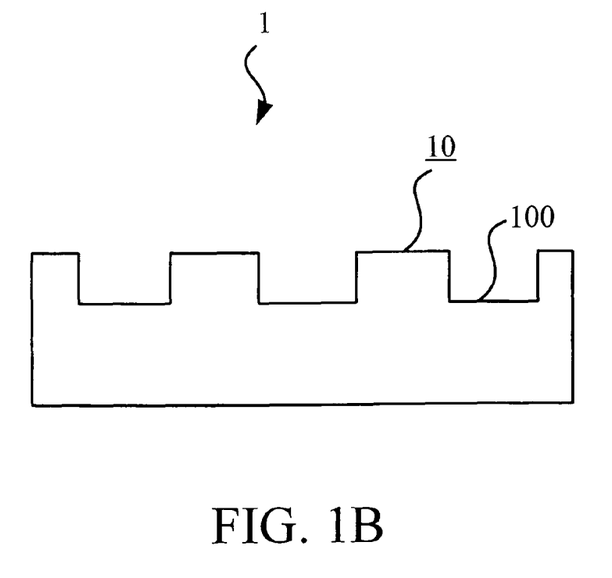

Please refer to FIG. 1A and FIG. 1B. FIG. 1A and FIG. 1B are the schematic diagrams of forming a substrate 1 according to an embodiment of the invention. The substrate 1 can be for epitaxy of a semiconductor light-emitting device.

In practical applications, the substrate 1 can be Si, GaN, AlN, sapphire, spinnel, SiC, GaAs, $Al_2O_3$, $LiGaO_2$, $LiAlO_2$, $MgAl_2O_4$.

An upper surface 10 of the substrate 1 has a plurality of electromagnetic-wave-scribed nicks 100. The epitaxy of the semiconductor light-emitting device is to be performed on the upper surface 10 of the substrate 1. In practical applications, the electromagnetic wave can be visible light, micro-wave, infrared, ultraviolet, laser or other energy sources capable of forming the nicks 100 on the upper surface 10 of the substrate 1.

As shown in FIG. 1A, in one embodiment, the electromagnetic wave can be a laser beam 12. Thereby, the upper surface 10 of the substrate 1 can be scribed by the laser beam 12 to form the plurality of electromagnetic-wave-scribed nicks 100 as shown in FIG. 1B.

Figure 2A:
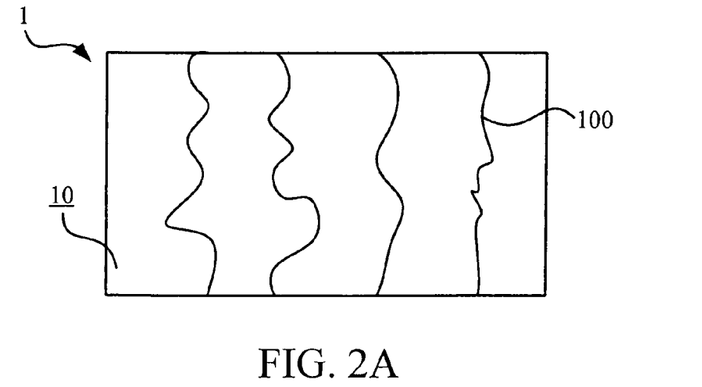
FIG. 2A to FIG. 2C are the top views of the substrate according to an embodiment of the invention.
Figure 2B:
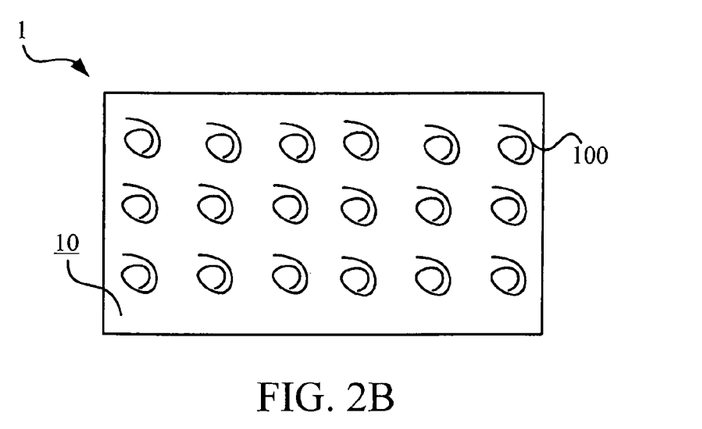
Figure 2C:
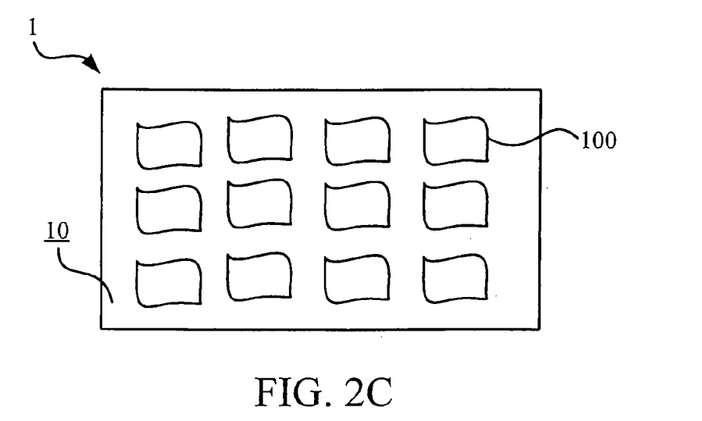

Please refer to FIG. 2A to FIG. 2C. FIG. 2A to FIG. 2C are the top views of the substrate 1 according to an embodiment of the invention. The focus and outline of the laser beam 12 can be adjusted by laser lens 14 (as shown in FIG. 1A) such that nicks 100 with specific patterns can be formed by the laser beam 12 on the upper surface 10 of the substrate 1. For example, as shown in FIG. 2A to FIG. 2C, the plurality of electromagnetic-wave-scribed nicks 100 can exhibit a circle, a trapezoid or a trace.

In practical applications, the plurality of electromagnetic-wave-scribed nicks 100 can exhibit various geometric or non-geometric patterns (i.e. not limited by the foregoing circle, trapezoid or trace) and can have particular radians or curvatures. The plurality of electromagnetic-wave-scribed nicks 100 can not only enhance the light-extraction efficiency of the semiconductor light-emitting device but also improve the epitaxy property of the semiconductor light-emitting device to enhance the opto-electronic effect thereof.

In one embodiment, the laser beam 12 (with a power of 25 mW and a wavelength of 248 nm or 193 nm) serving as the energy source can be focused to 5 um by the laser lens 14 to form nicks 100 with a diameter of 5 um and a pitch of 2 um on the surface of a sapphire substrate 1 with a diameter of 2 inches.

Figure 3A:
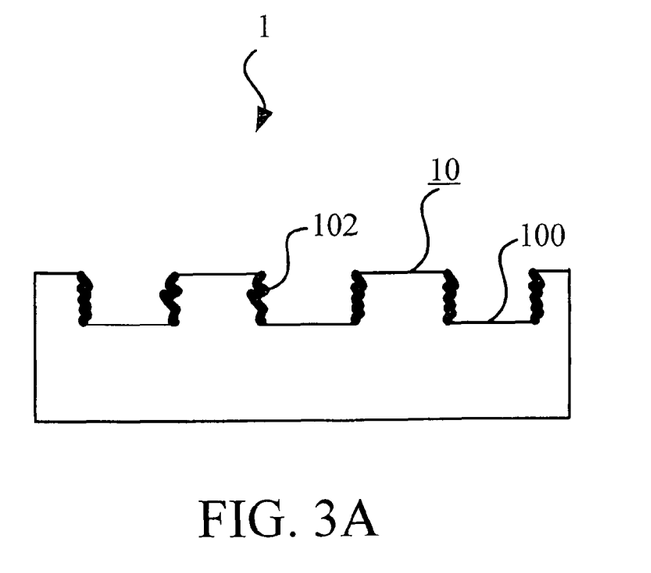
FIG. 3A and FIG. 3B are the schematic diagrams of the fusion sidewalls before and after removal of the substrate according to an embodiment of the invention, respectively

Please refer to FIG. 3A. It is noted that after the upper surface 10 of the substrate 1 is scribed by the laser beam 12, the plurality of nicks 100 can have fusion sidewalls 102. Because the fusion sidewalls 102 are burned-black and not transparent, the fusion sidewalls 102 can be removed such that the sidewalls 102 of the plurality of nicks 100 are transparent.

Figure 3B:
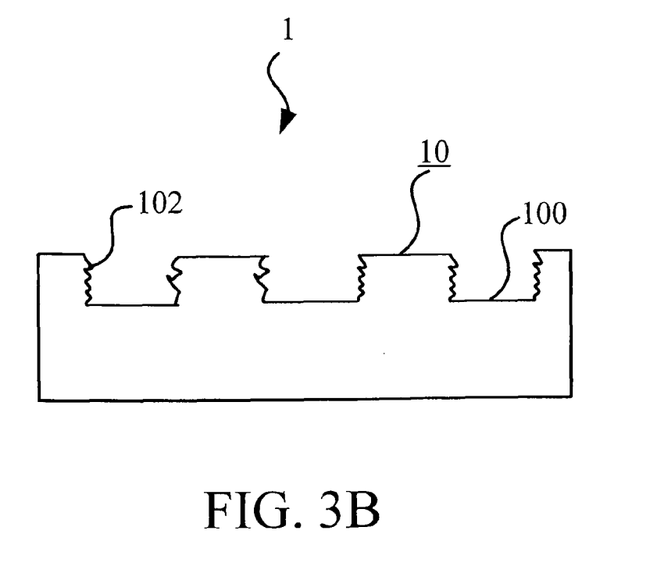

Please refer to FIG. 3A and FIG. 3B. FIG. 3A and FIG. 3B are the schematic diagrams of the fusion sidewalls 102 before and after removal of the substrate 1 according to an embodiment of the invention, respectively. In practical applications, the fusion sidewalls 102 can further be removed by a dry etching process or a wet etching process. As shown in FIG. 3B, after the fusion sidewalls 102 are removed, the sidewalls 102 of the plurality of nicks 100 can exhibit a rough morphology. Thereby, the rough sidewalls 102 can enhance the light-extraction efficiency of the semiconductor light-emitting device.

Besides, after the fusion sidewalls 102 are removed, the substrate 1 can be placed in MOCVD equipment for epitaxy of a light-emitting diode. In one embodiment, with precursors of TMGa and $NH_3$, an epitaxial layer of GaN which is about 1 um thick can be grown on the upper surface 10 of the substrate 1. Subsequently, an n-type dopant $SiH_4$ can be added to grow a layer of n-type GaN which is about 2 um thick. Then, a multiple quantum well based light-emitting layer made of InGaN/GaN can be formed on the n-type GaN. Finally, a layer of p-type GaN with a p-type dopant $Cp_2Mg$ can be formed on the light-emitting layer to finish the light-emitting diode.

The light-emitting diode fabricated on the substrate 1 according to the invention can have a light output power of 19 mW, which is increased by 26.7%, compared to the light-emitting diode fabricated on a conventional substrate and having a light output power of 15 mW.

Figure 4:
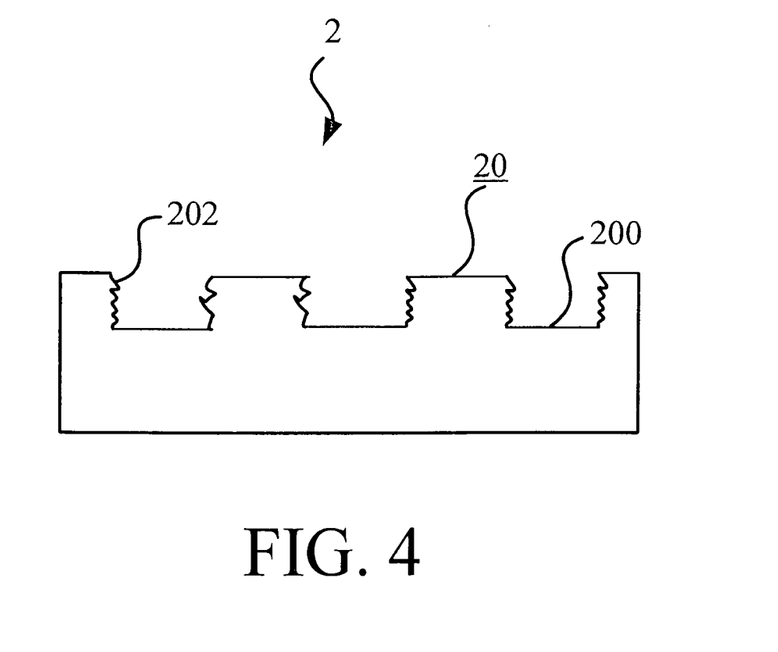
FIG. 4 is the schematic diagram of a substrate according to another embodiment of the invention.

Please refer to FIG. 4. FIG. 4 is the schematic diagram of a substrate 2 according to another embodiment of the invention. An upper surface 20 of the substrate 2 has a plurality of nicks 200, and the sidewalls 202 of each nick 200 have an average roughness equal to or larger than 1 nm. Thereby, the nicks 200 and the rough sidewalls 202 thereof can enhance the light-extraction efficiency of the semiconductor light-emitting device.

In one embodiment, the nicks 200 can be formed by an electromagnetic wave. The electromagnetic wave can be visible light, micro-wave, infrared, ultraviolet, laser or other energy sources capable of forming the nicks 200 on the upper surface 20 of the substrate 2.

Figure 5:
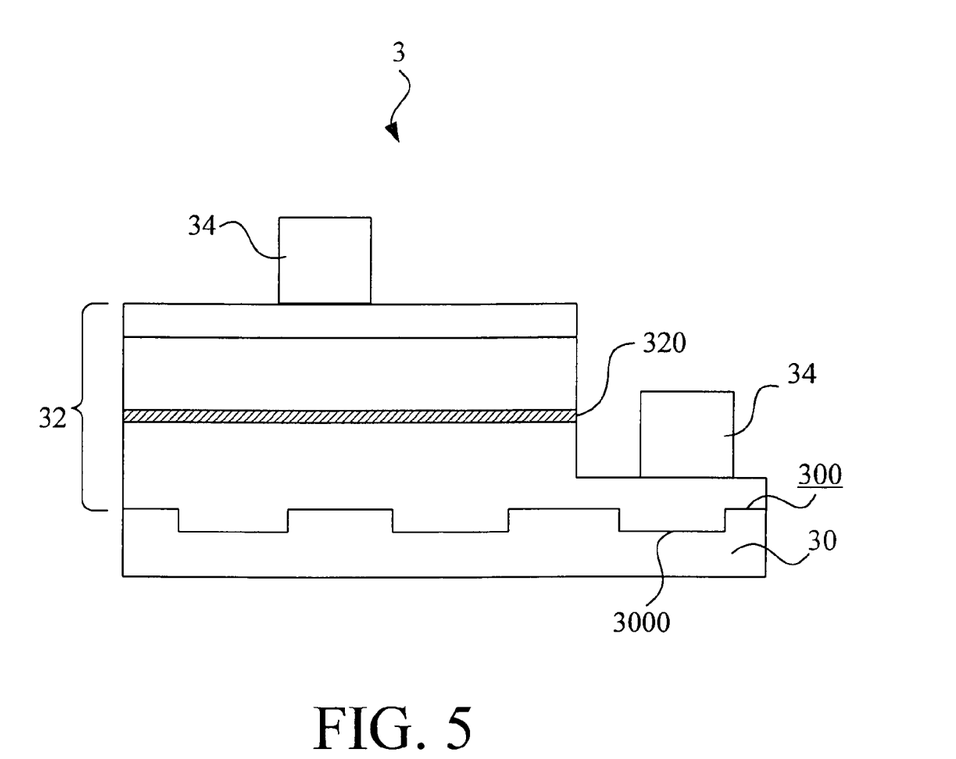
FIG. 5 is the schematic diagram of a semiconductor light-emitting device according to an embodiment of the invention.

Please refer to FIG. 5. FIG. 5 is the schematic diagram of a semiconductor light-emitting device 3 according to an embodiment of the invention. As shown in FIG. 5, the semiconductor light-emitting device 3 includes a substrate 30, a multi-layer structure 32, and an ohmic electrode structure 34. An upper surface 300 of the substrate 30 has a plurality of electromagnetic-wave-scribed nicks 3000. The multi-layer structure 32 is formed on the substrate 30 and includes a light-emitting region 320. The ohmic electrode structure 34 is formed on the multi-layer structure 32.

In practical applications, the electromagnetic wave can be visible light, micro-wave, infrared, ultraviolet, laser or other energy sources capable of forming the nicks 3000 on the upper surface 300 of the substrate 30.

Figure 6:
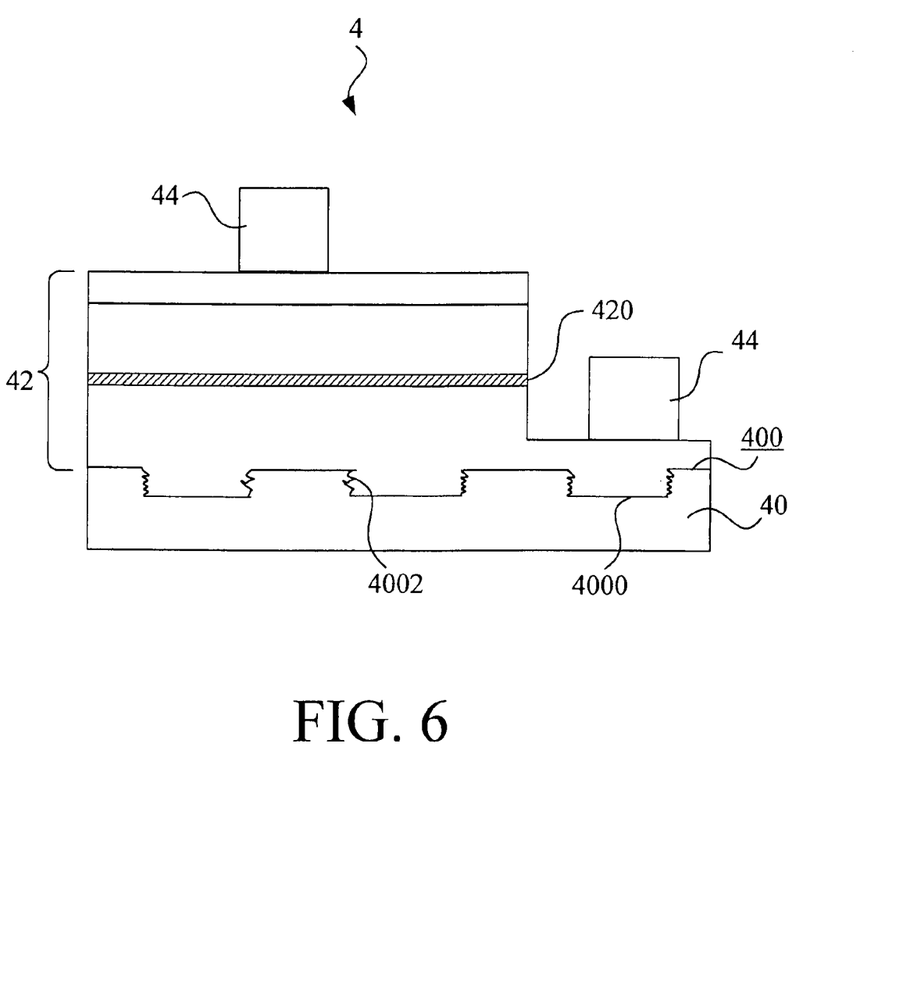
FIG. 6 is the schematic diagram of a semiconductor light-emitting device according to another embodiment of the invention.

Please refer to FIG. 6. FIG. 6 is the schematic diagram of a semiconductor light-emitting device 4 according to another embodiment of the invention. As shown in FIG. 6, the semiconductor light-emitting device 4 includes a substrate 40, a multi-layer structure 42, and an ohmic electrode structure 44. An upper surface 400 of the substrate 40 has a plurality of nicks 4000, and the sidewalls 4002 of each nick 4000 have an average roughness equal to or larger than 1 nm. The multi-layer structure 42 is formed on the substrate 40 and includes a light-emitting region 420. The ohmic electrode structure 44 is formed on the multi-layer structure 42.

In one embodiment, the nicks 4000 can be formed by an electromagnetic wave.

Please refer to FIG. 1A and FIG. 1B again. According to another embodiment of the invention is related to a method of treating a substrate 1. By use of an electromagnetic wave, the method scribes an upper surface 10 of the substrate 1 so that the upper surface 10 of the substrate 1 has a plurality of electromagnetic-wave-scribed nicks 100. Afterwards, the epitaxy of a semiconductor light-emitting device is to be performed on the upper surface 10 of the substrate 1.

Compared to the prior art, the substrate according to the invention is scribed by the electromagnetic wave to form a surface morphology such that light emitted from the semiconductor light-emitting device is scattered to reduce total reflection. Further, the external quantum efficiency and light-extraction efficiency of the semiconductor light-emitting device are enhanced. In particular, a conventional photolithography process is not required (i.e. mask-free) in the process of forming the surface morphology. Therefore, it takes much less time and reduces cost in the process of fabricating the substrate according to the invention.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of treating a substrate, comprising:
   forming a plurality of nicks on an upper surface of the substrate by an electromagnetic wave without using a mask, wherein sidewalls of each nick have fusion formed thereon;
   roughening the sidewalls by removing the fusion; and
   forming an epitaxial multi-layer structure on the upper surface and the nicks,
   wherein the roughened sidewalls of each nick comprise an average roughness equal to or larger than 1 nm.

2. The method of claim 1, wherein the electromagnetic wave is a laser beam.

3. The method of claim 1, wherein at least one of the nicks is formed in a circle, a trapezoid or a trace.

4. The method of claim 1, wherein the substrate is formed of a material selected from the group consisting of Si, GaN, AlN, sapphire, spinnel, SiC, GaAs, Al2O3, LiGaO2, LiAlO2, and MgAl2O4.

5. The method of claim 1, wherein the epitaxial multi-layer structure comprises a light-emitting region.

6. The method of claim 5, further comprising forming an ohmic electrode structure on the light-emitting region; wherein the light-emitting region comprises an n-type layer, a multiple quantum well and a p-type layer.

7. The method of claim 1, wherein the fusion is removed by a dry etching process or a wet etching process.

8. The method of claim 1, wherein the epitaxial multi-layer structure is filled in the nicks.

* * * * *